(12) United States Patent
Bayan et al.

(10) Patent No.: US 7,259,460 B1
(45) Date of Patent: Aug. 21, 2007

(54) WIRE BONDING ON THINNED PORTIONS OF A LEAD-FRAME CONFIGURED FOR USE IN A MICRO-ARRAY INTEGRATED CIRCUIT PACKAGE

(75) Inventors: Jamie A. Bayan, Palo Alto, CA (US); Ashok S. Prabhu, San Jose, CA (US); Chan Peng Yeen, Melaka (MY); Hasfiza Ramley, Cheras (MY); Santhiran S/O Nadarajah, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 151 days.

(21) Appl. No.: 10/871,218

(22) Filed: Jun. 18, 2004

(51) Int. Cl.
*H01L 23/34* (2006.01)

(52) U.S. Cl. .............................. 257/728; 257/E23.037; 257/E23.043

(58) Field of Classification Search ................. 257/728, 257/666, 678, 778, 787
See application file for complete search history.

(56) References Cited

U.S. PATENT DOCUMENTS

| | | | |
|---|---|---|---|
| 6,025,640 A * | 2/2000 | Yagi et al. ................... | 257/666 |
| 6,130,473 A | 10/2000 | Mostafazadeh et al. | |
| 6,132,529 A * | 10/2000 | Hatakeyama et al. ........ | 148/435 |
| 6,229,200 B1 | 5/2001 | Mclellan et al. | |
| 6,242,281 B1 | 6/2001 | Mclellan et al. | |
| 6,281,568 B1 | 8/2001 | Glenn et al. | |
| 6,348,726 B1 | 2/2002 | Bayan et al. ................ | 257/666 |
| 6,424,027 B1 | 7/2002 | Lamson et al. .............. | 257/676 |
| 6,429,508 B1 | 8/2002 | Gang .......................... | 257/678 |
| 6,433,277 B1 | 8/2002 | Glenn | |
| 6,455,356 B1 | 9/2002 | Glenn et al. | |
| 6,521,987 B1 * | 2/2003 | Glenn et al. ................. | 257/684 |
| 6,545,229 B1 | 4/2003 | Ma et al. ..................... | 174/263 |
| 6,630,728 B2 | 10/2003 | Glenn | |
| 6,674,156 B1 | 1/2004 | Bayan et al. | |
| 6,909,166 B2 | 6/2005 | Frezza et al. ................ | 257/666 |
| 2002/0136872 A1 | 9/2002 | Furuta et al. ................ | 428/200 |
| 2002/0168796 A1 | 11/2002 | Shimanuki et al. ......... | 438/106 |
| 2003/0071333 A1 * | 4/2003 | Matsuzawa .................. | 257/676 |
| 2005/0016750 A1 * | 1/2005 | Zimmerman ................ | 174/52.3 |

* cited by examiner

*Primary Examiner*—Howard Weiss
*Assistant Examiner*—John C. Ingham
(74) *Attorney, Agent, or Firm*—Beyer Weaver LLP

(57) ABSTRACT

Aspects of the invention recite wire bonding on thinned portions of a lead-frame that is configured for use in an IC package. A harder lead-frame material, improved adhesive tape, and various structural features of the lead-frame itself, in various combinations or subcombinations, facilitate the attachment of wire bonds to thinned areas of the lead-frame. This eliminates the need for supports placed directly under the bond sites, removing unwanted conductive areas on the outer surface of an IC package.

7 Claims, 7 Drawing Sheets

WIRE BONDING ON THINNED PORTIONS OF A LEAD-FRAME CONFIGURED FOR USE IN A MICRO-ARRAY INTEGRATED CIRCUIT PACKAGE

BRIEF DESCRIPTION OF THE INVENTION

This invention relates to the packaging of integrated circuits (ICs). More specifically, this invention relates to the design and fabrication of a micro-array IC package.

BACKGROUND OF THE INVENTION

Current semiconductor packaging technology often involves tradeoffs between ease and efficiency of manufacturing on the one hand, and various performance drawbacks on the other. For example, lead-frame based packages such as quad flat no-lead (QFN) packages employ lead-frames to facilitate the packaging and singulation of multiple units at once. However, lead-frame based packages, whose connectors are typically placed either on or extending from the sides, tend to have larger footprints than ball grid array (BGA) packages, whose solder ball connectors lie directly underneath the package. Unfortunately, BGA packages have drawbacks as well. Specifically, such packages often employ laminate substrates rather than uniform metal lead-frames, making them more expensive to produce than lead-frame based packages, and less efficiently manufactured.

It is therefore desirable to design packages that employ lead-frames for ease and efficiency of manufacture, but that also have BGA-type solder ball connectors for reduced footprint sizes. In light of the increased requirements for package cost and reliability, it is further desirable to improve various aspects of the design and manufacture of these packages.

SUMMARY OF THE INVENTION

Broadly speaking, the invention pertains to the design and fabrication of a lead-frame based IC package The invention can be implemented in numerous ways, including as a method, system, device, or apparatus. Several embodiments of the invention are discussed below.

In one embodiment of the invention, a substrate panel assembly for use in the packaging of integrated circuits comprises a lead-frame panel including an array of micro-array device areas. Each device area has a plurality of leads, each lead including elongated lead trace segments and a lead contact post, the lead contact posts being arranged in a micro-array. The lead contact posts are exposed at a bottom surface of the lead-frame panel, and the lead trace segments are not exposed at the bottom surface of the lead-frame. Also, the lead trace segments of at least some of the leads have portions extending between lead contact posts associated with adjacent leads. An adhesive tape is adhered to the lower surface of the contact posts, wherein the adhesive tape does not contact the lead trace portions. Furthermore, the lead frame panel has a Vickers hardness of at least approximately 160.

In another embodiment of the invention, a substrate panel assembly for use in the packaging of integrated circuits comprises a lead-frame panel including an array of device areas. Each device area has a die attach region configured to support a semiconductor die on an upper surface, posts extending to a lower surface of the lead-frame panel, and bond fingers extending from ones of the posts to a perimeter of the device area. The assembly also includes an adhesive tape applied to the lower surface of the posts. The lead-frame panel and adhesive tape having attributes allowing the application of an electrical connector extending from the semiconductor die to the bond fingers while the bond fingers, posts, and adhesive tape are supported only at the lower surface of the posts.

In another embodiment of the invention, a method of attaching an electrical connector to a lead-frame employs a substrate panel assembly having a lead-frame panel. The panel assembly includes at least one device area having a die attach region, posts extending to a lower surface of the lead-frame panel, and bond fingers having ends extending between ones of the posts and a perimeter of the device area, and intermediate sections therebetween, the substrate panel assembly further having an adhesive tape applied to the lower surface of the posts. A semiconductor die is affixed to the die attach region. While applying electrical connectors extending from the semiconductor die to ones of the bond fingers, the lower surface of the lead-frame panel and the adhesive tape is supported without directly supporting the intermediate sections of the bond fingers.

Other aspects and advantages of the invention will become apparent from the following detailed description taken in conjunction with the accompanying drawings which illustrate, by way of example, the principles of the invention.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

In one embodiment of the invention, an integrated circuit package is disclosed. The package has solder ball connectors on its lower surface, like conventional BGA packages. However, this package is produced using many features of lead-frame based packages. Such a package utilizes at least four different elements to achieve various improvements over the art. First, a lead-frame is employed with perforated die attach pads that allow encapsulant material to more easily flow underneath the dice, thus preventing process problems such as voids in the encapsulant layer. The drive toward smaller package sizes has also yielded smaller contact pads for placing solder ball connectors. As reductions in contact pad area also reduce the strength with which solder balls adhere to the package, a second improvement involves square contact pads that retain the same metal-to-metal clearance as standard circular contact pads, but that have a greater surface area. In this manner, embodiments of the invention yield stronger and more reliable solder ball connectors that still satisfy the constraints imposed by smaller package designs. Third, aspects of the invention allow for wire bonding directly to partially-etched areas of the lead-frame. Current wire bond sites must often be supported by support posts, or other unetched portions of the lead-frame, that leave exposed conductive areas on the outer surface of the package. As these conductive areas risk compromising the performance of the IC, they must be masked or otherwise insulated when the package is used, adding undesirable process time and expense. Wire bonding to an etched area, or an area otherwise unexposed after encapsulation, thus removes some of these undesired conductive areas. Fourth, a novel process for fabricating the IC packages of the invention is described.

Lead-Frame and Packaging

Figure 1A:
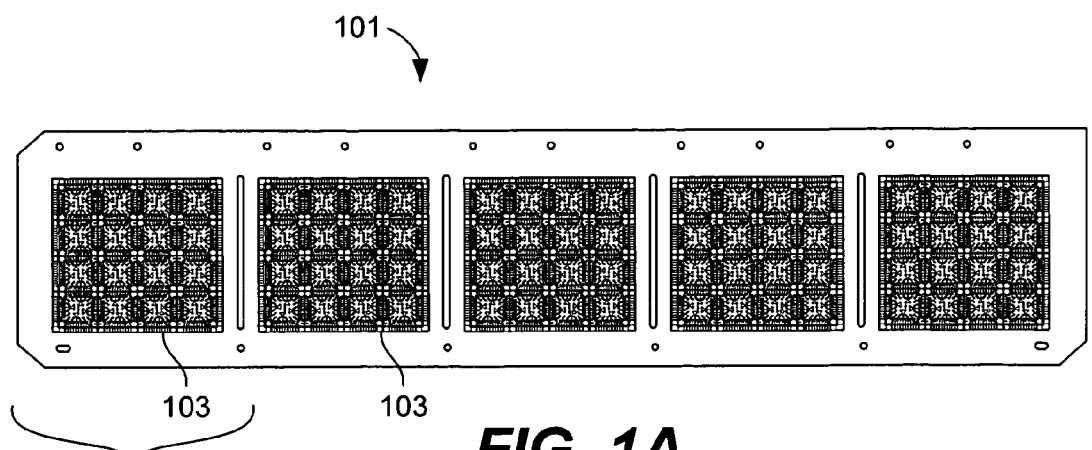
FIG. 1A illustrates a diagrammatic top view of a lead-frame strip suitable for use in packaging integrated circuits according to embodiments of the present invention.
Figure 1B:
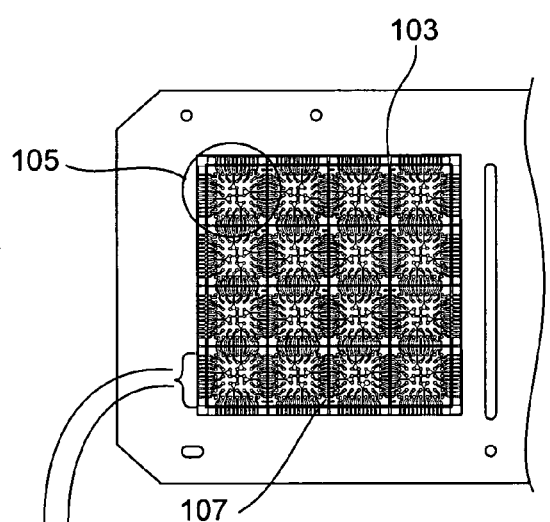
FIGS. 1B-1C illustrate successively more detailed views of selected elements of the lead-frame strip of FIG. 1A.

FIG. 1A illustrates a diagrammatic top view of a lead-frame strip suitable for use in packaging integrated circuits according to embodiments of the present invention. A lead-frame 101 can be configured as a metallic structure with a number of panels 103 of device areas. As illustrated in the successively more detailed FIGS. 1B-C, each panel 103 has a two dimensional array of device areas 105, each configured for use in a single IC package, and each connected by fine tie bars 107. During packaging, one or more semiconductor dice are affixed to each device area 105, where they are then subjected to known wire bonding, encapsulation, and singulation processes, yielding individual IC packages.

In order to facilitate these processes, each device area 105 has a number of leads 111, each supported at one end by the tie bars 107. In the illustrated embodiment, the leads 111 have contact posts 113 formed at the distal end of the lead. Each post extends to the bottom surface of the lead-frame 101 to provide a conductive contact pad 216 at the bottom surface of the lead frame. The leads 111 are etched, half-etched, or otherwise thinned relative to the posts 113, so as to provide electrical connection to the posts 113 without leaving exposed conductive areas on the bottom surface of the lead frame, which as will be explained below may be packaged in a manner so that it becomes co-planar the outer surface of the encapsulated package.

Figure 1C:
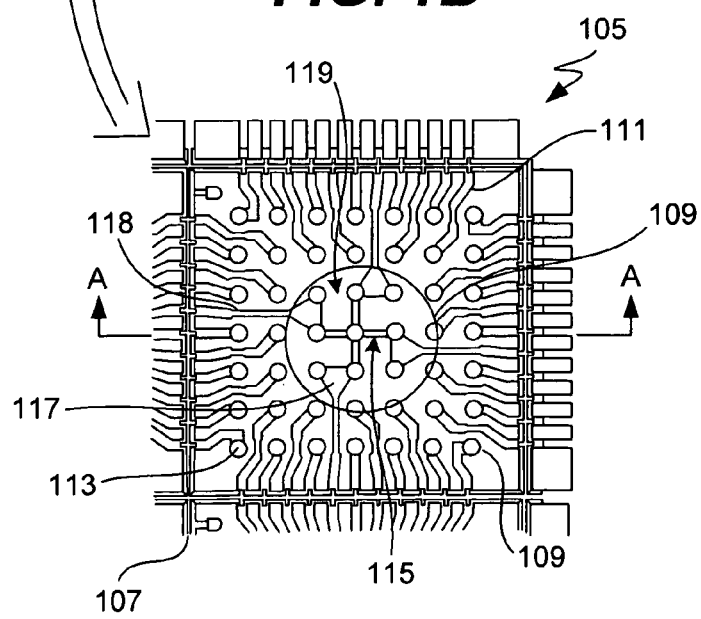
Figure 2:
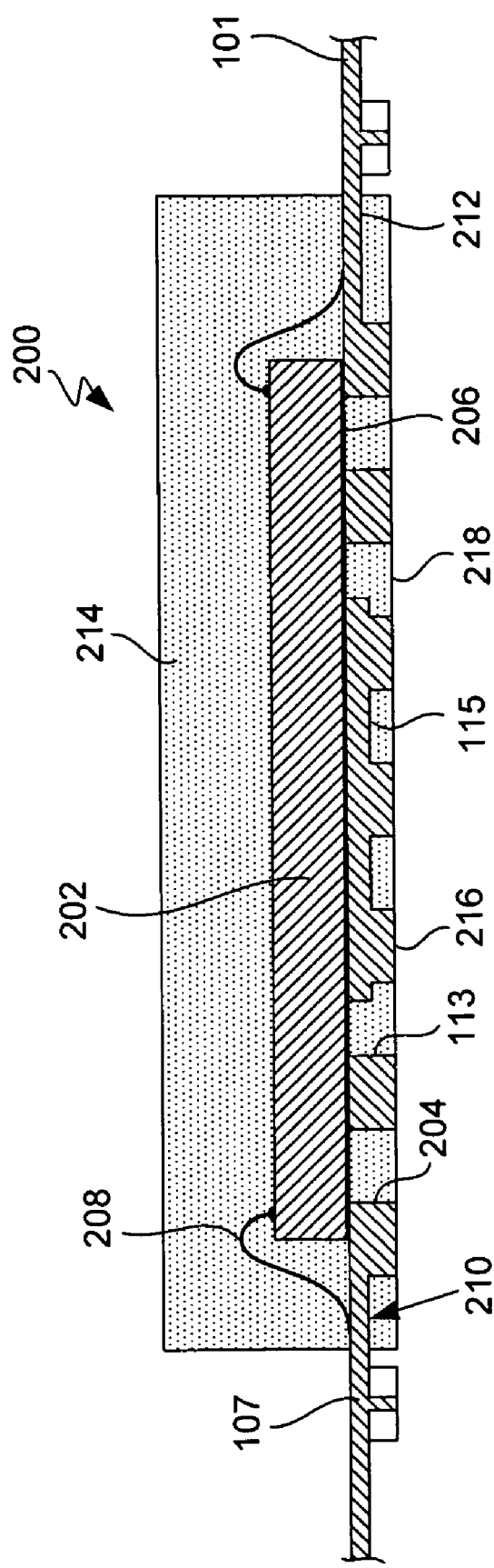
FIG. 2 illustrates a cross-section of a packaged IC employing features of the present invention.

FIG. 2 illustrates cross-section A-A of FIG. 1C, after the lead-frame 101 has already been subjected to the die attach, wire bond, and encapsulation processes. The resulting IC package 200 has a semiconductor die 202 that is attached to the substrate 204 with an adhesive 206. The package 200 also has bond wires 208 that electrically connect the die 202 to the bond sites 210 of the leads 212. An encapsulant 214, e.g., a known molding material, surrounds the die 202 and substrate 204, leaving only exposed contact pads 216 (which are simply the lower surfaces of the posts 113) at the bottom surface 218 of the package.

The package 200 is shown after encapsulation, but prior to singulation. In practice then, electrical connectors such as solder balls are attached to the contact pads 216 (often, but not necessarily, after plating or cleaning the pads 216 to inhibit/remove oxidation), and the lead-frame 101 is singulated (commonly sawed) along its tie bars 107, to cut away each individual package 200. In this manner, a novel package is fabricated, in which a "micro-array" of solder connectors exist on the bottom surface 218, allowing the package 200 to be used as a BGA-type package, yet employing lead-frame based fabrication techniques for ease and efficiency of manufacture. The resulting "micro-array" package thus offers many advantages inherent in both BGA-type packages and QFN-type packages. To facilitate manufacture of these micro-array packages 200, a number of novel features may be employed, several of which are discussed below in further detail.

Die Support Structure

As discussed briefly above, a die 202 is attached to a die attach region of the lead-frame where it overlaps die attach structure 109 and possibly portions of some of the leads 111. After the die is adhesively secured to the lead-frame, it is wirebonded and encapsulated with a molding material 214. However, during encapsulation, liquefied molding material 214 must flow under and around all the various structures of the device area 105, or else voids may form in the encapsulant 214. Such voids risk leaving exposed electrically conductive areas on the outer surface of the package 200 that leave the package 200 vulnerable to electrical shorts or other forms of damage.

In order to help alleviate this problem, the lead-frame 101 of FIG. 1C includes the die support structure 109. More specifically, the die support structure 109 is configured not as a single rectangular die attach pad-like structure, as might be used in various other packaging styles, but rather as a lattice-like structure capable of supporting a die 202 while allowing sufficient space for encapsulant material to flow therethrough. For example, in FIG. 1C, the die support structure 109 is made up of an array of posts 113 interconnected by struts 115, or support risers, that provide structural stability while still allowing flow of the molding material. In essence, the struts 115 are portions of the lead-frame 101 that have been half-etched (or subjected to any other process by which material can be removed from the lead-frame 101) like the leads 111, so as to leave space between the bottom surface 218 and the strut 115. In this manner, encapsulant material can flow under the die 202 and through the open areas 119 in the lead-frame 101, as well as under the struts 115 themselves. The struts 115 thus provide a lattice-like structure that leaves open areas 119 which span the full height of the lead-frame 101. This allows encapsulant to flow through a larger area than would be possible if the bottom surface of a large rectangular die attach pad was etched to define a number of posts 113, which would lack such full-height open areas 119.

One of skill will observe that the generally "swastika-shaped" appearance of the die support structure 109 creates four open areas 119 for encapsulant to flow through relatively unimpeded. Additionally, the half-etched struts 115 provide space underneath them, further facilitating encapsulant flow under the die 202.

In the embodiment illustrated in FIG. 1C, the die support structure also includes a plurality of support bars 118 that carry the die support structure 109 and pads 117. In the illustrated embodiment, the pads 117 appear as enlarged legs of the "swastika-shaped" die support structure. Like the struts 115 and leads 111, the pads 117 and support bars 118 are partially etched from the bottom surface so that they are not exposed at the bottom surface of the lead-frame. The illustrated pad structure has a number of advantages including providing additional structural stability for the die support structure and when the die is not significantly larger than the die support structure, they may also serve as wirebonding surfaces that facilitate downbonding from the die to the die support structure 112. As will be appreciated by those familiar with packaging generally, it is sometimes desirable to make an exposed die attach pad a ground (or power) plane. In the illustrated embodiment, the die support structure 109 may be configured as a ground (or power) plane simply by downbonding to the pads 117 and/or the support bars 118.

Figure 3:
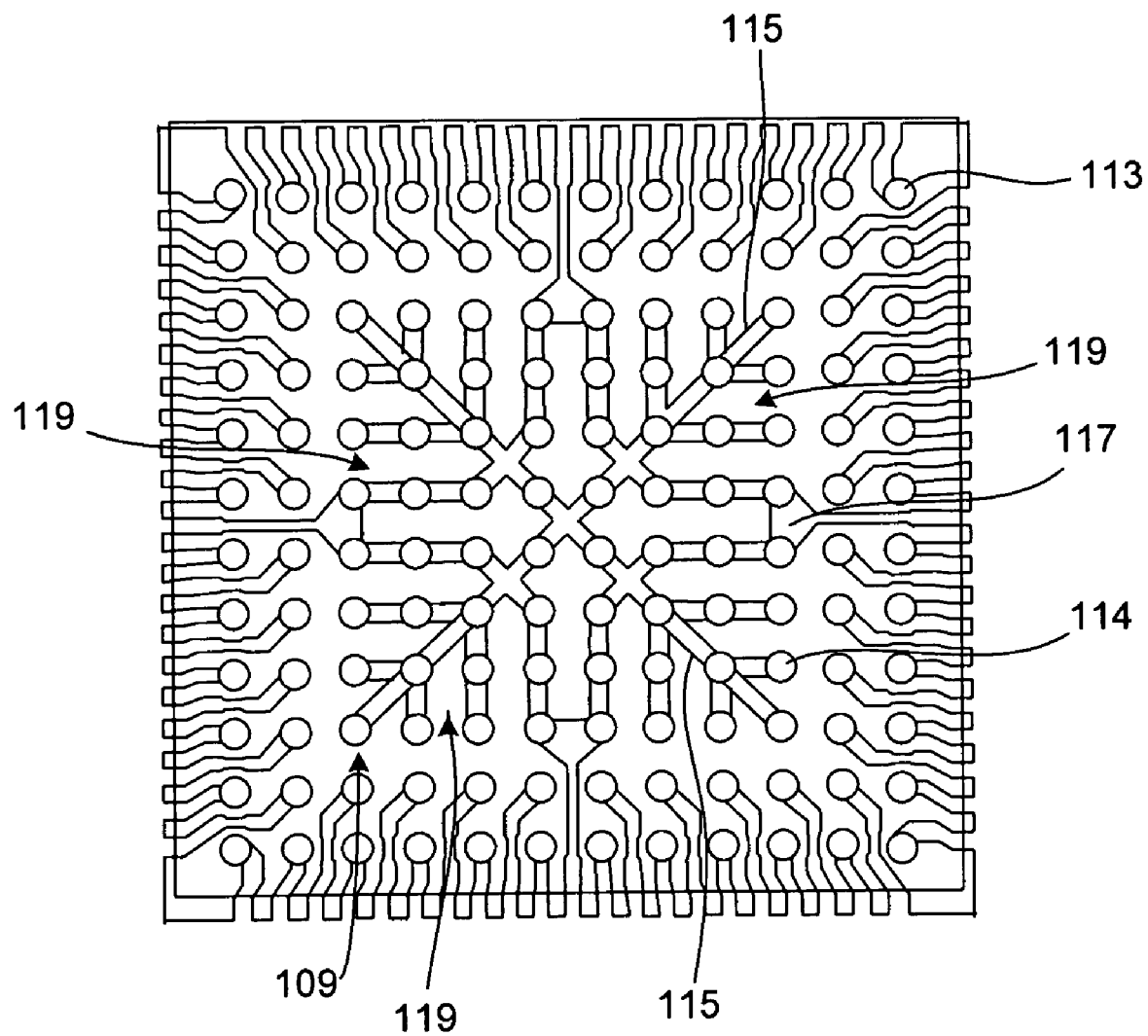
FIG. 3 is a detailed top view of a die attach area having posts and etched struts arranged in a snowflake configuration to facilitate flow of encapsulant.

One of skill will also observe that the various lead-frame configurations of the invention need not be limited to the swastika like shape of FIG. 1C. Rather, a wide variety of die support structures may be used to facilitate the flow of encapsulant material underneath the die 202. For example, FIG. 3 illustrates a die support structure 109 with a generally "snowflake-shaped" configuration in which the posts 114 are interconnected by half-etched struts 115 arranged as shown. Such an arrangement helps create open areas 119 that channel flow of encapsulant toward the center of the die support structure 109, an area where voids are often most likely to be formed. As in the swastika-shaped configuration (and indeed, many other possible configurations), pads 117 can be provided to allow for downbonding and increased structural stability of the lead-frame 101, while still allowing encapsulant to flow underneath.

In the illustrated embodiments, a unitary die support structure is provided, wherein all of the struts are electrically connected. In other embodiments, the die support structure may be divided into two or more components. Such an approach can be particularly useful in situations where it is desirable to provide multiple independent ground/power planes.

Contact Pads

Figure 4A:
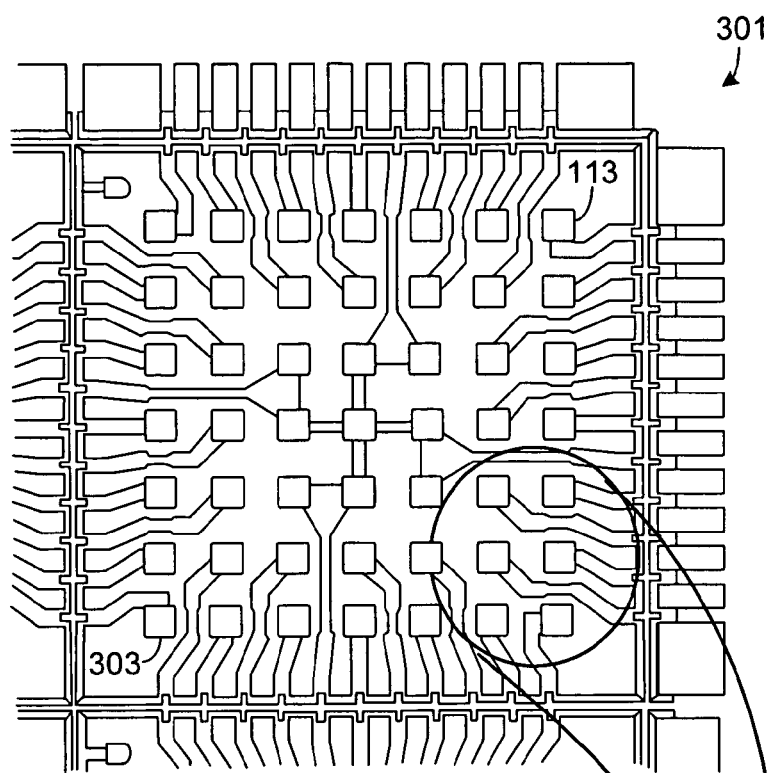
FIGS. 4A-B illustrate successively detailed bottom views of a device area with generally square contact pads constructed in accordance with an embodiment of the present invention.
Figure 4B:
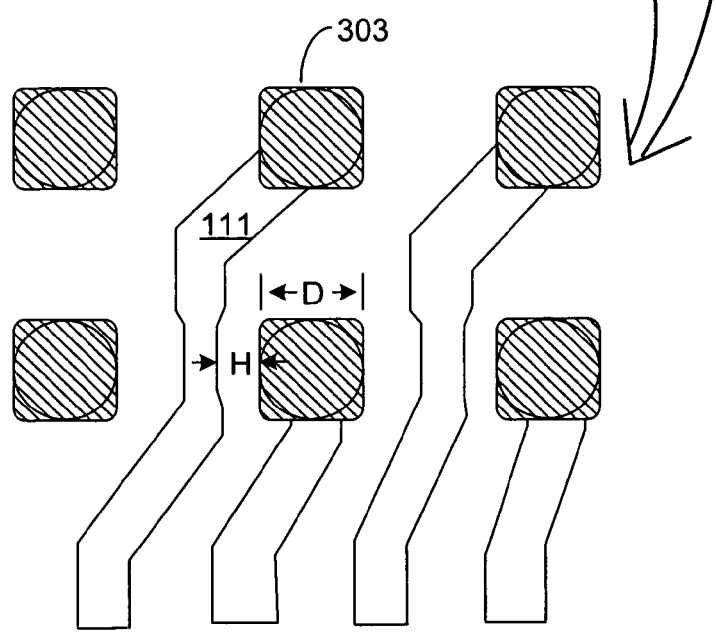
Figure 5:
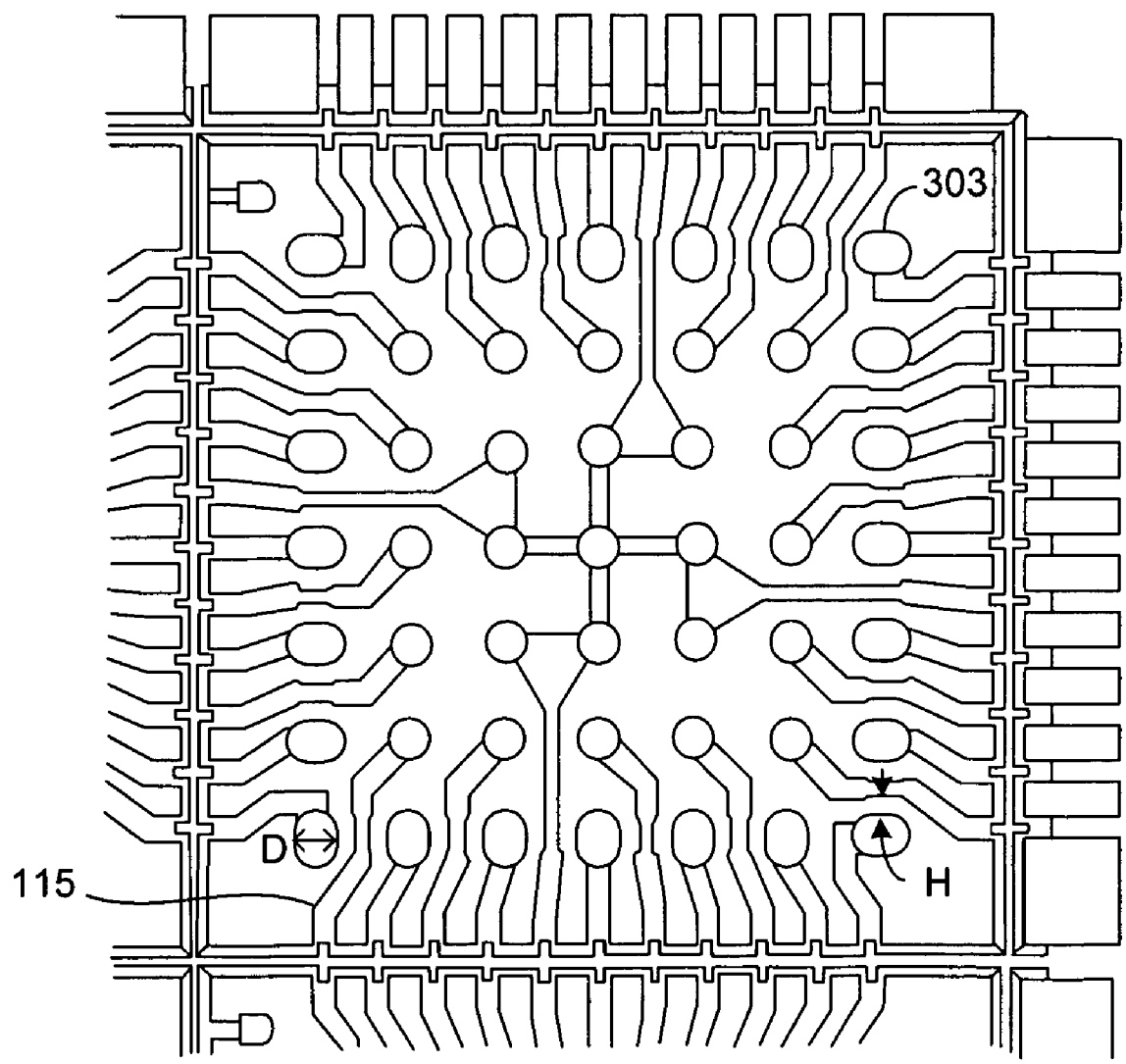
FIG. 5 is a bottom view of a device area with generally oblong contact pads constructed in accordance with an embodiment of the present invention.

Referring next to FIGS. 4 and 5, some other embodiments will be described that utilize non-circular contact pads on the contact posts. In the embodiment illustrated in FIGS. 4A and 4B, the contact pads have a substantially square footprint, instead of the substantially circular footprint illustrated in FIG. 1C. With reference to FIG. 1C again, note that a certain metal-to-metal clearance H must be maintained in order to prevent electrical interference between leads 111 and adjacent posts 113. One commonly used rule states that H must be approximately equal to or greater than half the height of the contact posts. Thus, for 0.5 mm thick lead frames, H must be maintained at least at 0.25 mm. The exact numerical value for the clearance H varies, and is not central to the invention, but does typically impose a design constraint: the cross-sectional area of the posts 113 (i.e., the contact pad size) must be sufficiently small that the distance H between the posts 113 and adjacent leads 111 is always maintained. However, reducing contact pad size also reduces the strength with which solder connectors adhere to their contact pads.

As a solution to this dilemma, embodiments of the invention employ generally noncircular contact pads whose shapes allow for increased surface area relative to circular contact pads, yet maintain the same metal-to-metal clearance as conventional circular contact pads. As one example, FIG. 4A illustrates a bottom view of a device area 301 of a lead-frame 101, in which the posts 113 are fabricated with generally square cross-sections. These square cross-sections yield generally square contact pads 303 that have greater cross-sectional areas than equivalent circular contact pads. FIG. 4B illustrates this concept in greater detail. Note that, in order to maintain a minimum metal-to-metal clearance H between a contact pad 303 and its adjacent lead 115 without excessively thinning the lead 115 (which poses many known problems), a circular contact pad 303 can at maximum have a diameter D, as shown. However, one can observe that a square contact pad 303 with sides of length D offers greater surface area than the circular contact pad, while maintaining the same metal-to-metal clearance H. This increased surface area increases the size of, and thus improves the shear strength and reliability of, the solder joint. Consequently, such an increase in surface area relative to circular pads allows for stronger and more reliable connections between the contact pads and their solder connectors, such as solder balls.

It should be noted that the use of noncircular contact pads does not affect the fabrication of IC packages 200. That is, packages employing square contact pads 303 may be fabricated in the same manner as described above (and further explained below). It should also be noted that while FIGS. 4A-B employ generally square contact pads 303, the invention need not be so limited. Rather, the invention contemplates the use of any shape contact pad 303 that is designed to offer increased surface area relative to a circular contact pad having the same minor axis dimension, and that maintains or increases the corresponding metal-to-metal clearance H. For example, FIG. 5 illustrates a lead-frame 101 employing oblong posts 113 whose bottom surfaces provide oblong-shaped contact pads 303. More specifically, if the width (minor axis dimension) of the oblong pads 303 is maintained as D while the height, or longitudinal direction (major axis dimension), is increased to a length sufficiently greater than D, the oblong pad 303 can offer greater surface area than a circular contact pad 303 with diameter D. Furthermore, this can be done while the metal-to-metal clearance is maintained at H.

Further embodiments of the invention allow for generally square contact pads that have sides of length D, yet offer similar surface area than even a circular contact pad with diameter greater than D. For instance, is known that generally circular contact pads having diameters of 0.25 mm yield acceptable solder connector strength and reliability. The ability to manufacture posts 113 having a diameter of 0.225 mm is also known and is desirable, yet yields weaker and less reliable solder connectors. Consequently, embodiments of the invention include use of generally square contact pads 303 that have sides of length 0.225 mm, thus offering the same metal-to-metal clearance as circular pads of diameter 0.225 mm, yet having greater surface areas. More specifically, by sufficiently reducing the amount that the corners of the square contact pad 303 are rounded (in this example, limiting the corner radius to a maximum of 0.05 mm), one of skill can see that a generally square contact pad 303 having sides of length 0.225 mm can achieve 99% of the surface area of even a 0.25 mm circular contact pad.

Thin Wire Bond Sites

Yet another aspect of embodiments of the invention involves wire bonding to an etched or otherwise thinned portion of the lead-frame 101. For example, FIG. 2 illustrates bond wires 208 that have been wirebonded directly to half-etched bond sites 210 of leads 212. Conventional bond sites must be directly supported. That is, the lead-frame 101 must have an unetched portion that extends to the bottom surface 218 in the area directly beneath the wire bond, or some other form of support for the bond site 210. Otherwise, conventional bond sites are unable to support the stresses of wire bonding operations without flexing or bowing excessively, or simply giving way entirely. One approach to supporting the bond site 210 involves filling the area underneath the bond site 210 with encapsulant material prior to wire bonding, as is explained in the co-pending U.S. patent application Ser. No. 10/650,325 to Bayan et al., which is hereby incorporated by reference in its entirety and for all purposes.

Another approach, taken in embodiments of the present invention, involves the cumulative effect of various improvements to a lead-frame 101 and its associated structures. By way of example, one described embodiments of the invention employs three features that work together to make is practically possible to wire bond directly to half-etched (or otherwise thinned) bond sites 210: 1) a harder lead-frame material is employed, 2) a stronger support tape is used, and 3) various structural features are incorporated into the lead-frame 101 itself.

With regard to the material of the lead-frame 101, current lead-frames are often made of alloys too weak to support wirebonding when their leads 212 are thinned. Commonly, it is well known that such alloys exhibit excessive bowing or other deformation when subjected to wirebonding, thus producing poor wire bonds. For example, known alloys such as C194 copper alloy from Olin Corp. are of insufficient hardness to support wirebonding on half-etched areas of many lead-frames made from it. However, it has been found that materials with Vickers hardnesses of at least 160 to 195 (which is in the range of at least approximately 35% to 50% greater than the hardness of C194) are sufficiently hard to withstand wirebonding on half-etched areas of a 6 mil thick lead-frame when employed along with other described features.

Such harder materials are known, and include alloys such as C7025 from Olin Corp., as well as Eftec 64T from The Furukawa Electric Co., Ltd. The invention is, however, not limited to the use of these specific alloys. Rather, it contemplates use of any lead-frame material of sufficient hardness to withstand, alone or in combination with other features of the invention, wirebonding operations on leads made from the material and thinned to a thickness of less than the thickness of the lead-frame.

As to the support tape, current fabrication processes often employ an adhesive tape backing attached to the bottom surface 218 to further reinforce the lead-frame 101 during wirebonding. However, many current adhesive tapes adhere to the lead-frame 101 with insufficient strength, allowing for excessive bowing of the leads 212 at the bond sites 210, and absorbing too much energy during wirebonding, thus yielding poor wire bonds. It has been found that adhesive tapes employing thermoplastic adhesives, that have greater adhesive properties than current lead-frame tapes, secure the lead-frame 101 and absorb reduced amounts of energy during wirebonding, so as to facilitate wirebonding on thinned leads 212. For example, RT321 produced by Hitachi, Ltd. has been found to yield satisfactory wire bonds when employed in conjunction with other features of the invention.

As with the lead-frame material, the invention is of course not limited to the use of specific tapes. Rather, it contemplates use of any tape having sufficient adhesive properties to allow, alone or in combination with other features of the invention, wirebonding operations on leads that are thinned to a thickness of less than the thickness of the lead-frame.

Figure 6A:
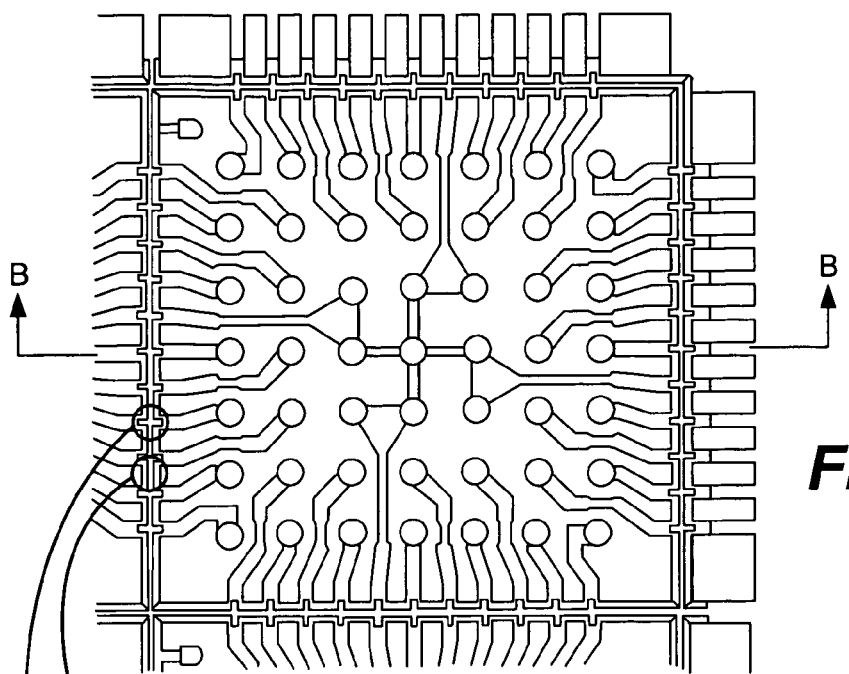
FIGS. 6A-E are assorted views of various lead-frame assembly features that collectively facilitate wire bonding to etched bond sites.
Figure 6B:
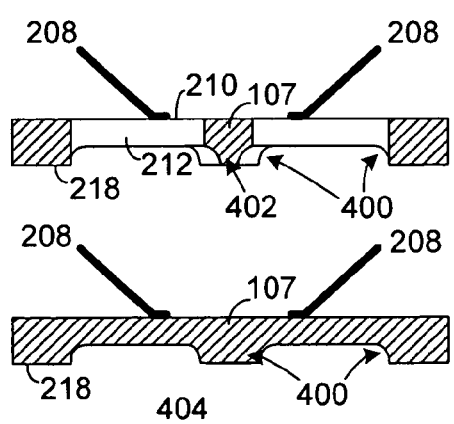
Figure 6C:
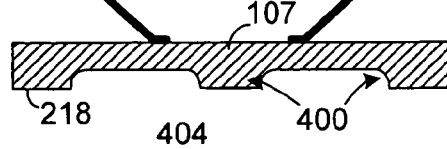
Figure 6D:
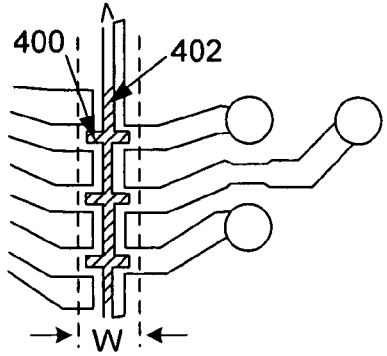
Figure 6E:

FIGS. 6A-E illustrate some such structural features employed in an embodiment of the invention to help facilitate direct wirebonding to a thinned lead. First, recall that tie bars 107 are employed to connect adjacent device areas 105, as described above. Commonly, these tie bars 107 are simply straight sections of the lead-frame 101. Often, the tie bars are thinned like the leads in order to reduce the amount of material that must be cut through during singulation. However, longitudinal ribs 402 and lateral ribs 400 can be added underneath the tie bar 107. FIG. 6B illustrates a cross sectional view of a tie bar 107 and leads 212 along a section of the tie bar 107 in between lateral ribs 400, in which longitudinal ribs 402 can be seen, and in which lateral ribs 400 are visible in the background. FIG. 6C illustrates a cross sectional view of the tie bar 107 and leads 212 alone a section of the tie bar 107 having lateral ribs 400. The lateral ribs 400 are placed adjacent to leads 212, and extend toward the bond sites 210 of the leads 212 so as to provide extra support for the bond sites 210. Such ribs 400 can also be placed at the opposite end of the lead 212, so as to provide additional support from the other end of the bond site 210 as well.

In certain embodiments, it is preferable to configure the ribs 400, 402 with saw singulation in mind. More specifically, when the tie bars 107 are cut away during singulation, it is often preferable to cut away the rib supports as well, so as to minimize the amount of conductive surface exposed at the outer surface of the IC package. Thus, as shown in FIG. 6C for singulation by a saw blade of width W, the lateral ribs 400 can be configured to extend less than W/2 distance from the centerline of the tie bar 107 toward the bond site 210, so that the entirety of the lateral rib 400 is cut away by the saw blade.

The longitudinal ribs 402 are intended to extend along the length of the tie bars. It should be noted that the presence of ribs 400, 402 adds material that must be sawed away during singulation. This extra material contributes to many process inefficiencies, such as reduced saw blade life, longer process time as more material must be cut away, etc. To help alleviate these issues, the longitudinal ribs are designed to be significantly narrower than the tie bars themselves.

In other embodiments, additional material can be removed from the tie bars 107. For example, material along the centerline 404 of the tie bar can be etched away or otherwise removed, with thin connectors left connecting adjacent ribs 400. In other words, adjacent ribs can be kept as single solid structures, connected only to each other. The invention includes any such configuration in which material is removed from the tie bars 107 to facilitate saw singulation without excessively compromising the structural integrity of the lead-frame 101.

Leads 111 themselves can also be designed to assist in wirebonding to their half-etched portions. More specifically, the leads 111 in the lead portion 402 of the device area 105 are oriented generally in a "fan" configuration with the major axis of each lead 111 oriented toward the geometric center of the device area 105. In this fashion, one of skill can see that more wirebonding loads are directed axially, where the leads 111 are stronger, rather than in a transverse direction, where they are weaker.

Method of Fabrication

Figure 7:
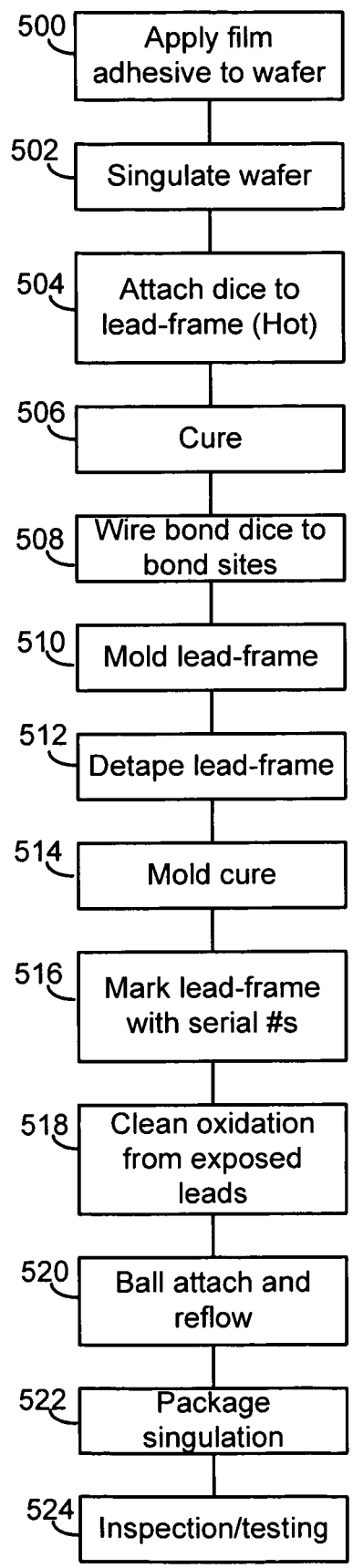
FIG. 7 illustrates process steps for fabricating IC packages in accordance with embodiments of the present invention.

A method of fabricating IC packages 200 is now described. FIG. 7 illustrates process steps taken in the fabrication of such packages 200. Many of the individual steps shown are not in themselves novel. However, the particular combination of process steps is believed to be novel.

The process begins with a semiconductor wafer, which is a standard configuration for fabricated ICs prior to dicing. A film adhesive such as a known B-stage adhesive is applied to the back side of the wafer (step 500), and the wafer is then diced (step 502). Dicing the wafer after application of the adhesive allows for application of the adhesive in a single operation and to a single body—the wafer—rather than in multiple operations to many individual IC dice. For B-stage adhesives or other adhesives that require heating prior to die attach, the dice are heated to the appropriate temperature and then attached to the die attach regions 109 of the device areas 105 (step 504). If necessary, the adhesive is then cured (step 506). Once the curing process is complete, the dice are wire bonded to the appropriate bond sites (step 508) and the lead-frame 101 is encapsulated (step 510), de-taped (step 512), and cured to harden the molding material (step 514).

Once the lead-frame 101 is encapsulated, serial numbers or other identification numbers can be imprinted on the outer surface of the encapsulation material (step 516), and the solder balls or other connectors can be attached. Recall that, as the package 200 is a BGA-type package from an external point of view, contact pads remain exposed on the underside of the package 200. If solder-based connectors are employed, any oxidation is first cleaned from the contact pads 303 (step 518). The surfaces of the contact pads 303 are then treated appropriately, such as by application of Ni—Au plating if desired, or in some embodiments, simple cleaning with no other application of material to the pads 303. Solder connectors are then attached to the contact pads 303, such as by known reflow or ball attach processes (step 520). The individual packages can then be saw singulated (step 522), where they are then ready for inspection and/or testing (step 524).

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings. For example, although a number of significant features of the illustrated micro-array packages have been described, it should be appreciated that the different features do not need to be used together. Rather, many of the described features may be employed individually or in subcombinations in different micro-array lead frame packages.

In the illustrated packages, the contact posts 113 were generally illustrated at the distal end of the leads 111 and most of the leads had a single contact post. However, these are not requirements. Rather, each lead can interconnect multiple contact posts 113, and vice versa.

With respect to the described die attach structure feature, the struts need not be limited to swastika-shaped, or snowflake-shaped, configurations, but rather can assume any configuration that facilitates flow of the encapsulant material under the die and that prevents voids. Likewise, the leads of the die attach regions can be made of any lead-frame compatible material that is of sufficient hardness to facilitate wirebonding on their half-etched, or otherwise thinned, portions. Additionally, the contact pads can be generally square, generally oblong, or any non-circular shape that affords relatively greater surface area while maintaining appropriate metal-to-metal clearances. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A substrate panel assembly for use in the packaging of integrated circuits, comprising:
   a lead-frame panel including an array of micro-array device areas and a matrix of tie bars that support the device areas, each device area having a plurality of leads, each lead including elongated lead trace segments and a lead contact post, the lead contact posts being arranged in a micro-array, the lead contact posts being exposed at a bottom surface of the lead-frame panel, and the lead trace segments not being exposed at the bottom surface of the lead-frame, wherein the lead trace segments of at least some of the leads have portions extending between lead contact posts associated with adjacent leads and wherein at least some of the tie bars include lateral support ribs formed on the tie bars, each lateral support rib being positioned under an associated tie bar adjacent a lead trace segment, the lateral support ribs being exposed on the bottom surface of the lead frame panel and arranged and sized such that the lateral support ribs may be removed along with the tie bars during singulation processes;
   an adhesive tape adhered to the lower surface of the contact posts, wherein the adhesive tape does not contact the lead trace segments;
   a plurality of dice, each die being mounted on an associated device area; and
   a plurality of bonding wires that electrically connect the dice to at least some of the leads in an associated device area, wherein at least some of the bonding wires are bonded to lead trace segments that are associated with contacts posts that underlie an associated die; and
   wherein at least some of the leads are configured such that the bonding wires are securely wire bonded to portions of the lead trace segments that are not in contact with the adhesive tape or otherwise directly supported during a wire bonding operation.

2. The substrate panel assembly of claim 1 further comprising an encapsulant material that covers an array of device areas encapsulating the associated dice, bonding wires and lead trace segments.

3. The substrate panel assembly of claim 1 further comprising a plurality of longitudinal support ribs, each longitudinal support rib extending along an associated tie bar and intersecting a plurality of the lateral support ribs, the widths of the longitudinal support ribs being narrower than the widths of their associated tie bars.

4. The substrate panel assembly of claim 1 wherein the lead frame is formed from Eftec 64T.

5. The substrate panel assembly of claim 1 wherein the lead trace segments extend generally radially from a geometric center of the associated device area.

6. A substrate panel assembly for use in the packaging of integrated circuits, comprising:
   a lead-frame panel including an array of micro-array device areas and a matrix of tie bars that support the device areas, each device area having a plurality of leads, each lead including elongated lead trace segments and a lead contact post, the lead contact posts being arranged in a micro-array, the lead contact posts being exposed at a bottom surface of the lead-frame panel, and the lead trace segments not being exposed at the bottom surface of the lead-frame, wherein the lead trace segments of at least some of the leads have portions extending between lead contact posts associated with adjacent leads and wherein at least some of the tie bars include support ribs that are narrower than their associated tie bars and are exposed on the bottom surface of the lead frame;

an adhesive tape adhered to the lower surface of the contact posts and the ribs and wherein the adhesive tape does not contact the lead trace segments;

a plurality of dice, each die being mounted on an associated device area; and a plurality of bonding wires that electrically connect the dice to at least some of the leads in their associated device areas, wherein at least some of the bonding wires are bonded to lead trace segments that are associated with contacts posts that underlie an associated die; and an encapsulant material that covers an array of device areas encapsulating the associated dice, bonding wires and lead trace segments; and wherein the lead frame panel has a Vickers hardness of at least approximately 160 and at least some of the leads are configured such that the bonding wires are securely wire bonded to portions of the lead trace segments that are not in contact with the adhesive tape or otherwise directly supported during a wire bonding operation.

7. The substrate panel assembly of claim 1 wherein the lead frame panel has a Vickers hardness of at least approximately 160.

* * * * *